(12) United States Patent
Joung et al.

(10) Patent No.: US 7,855,113 B2
(45) Date of Patent: Dec. 21, 2010

(54) METHOD FOR FABRICATING SEMICONDUCTOR MEMORY DEVICE

(75) Inventors: Yong Soo Joung, Icheon-si (KR); Seung Woo Jin, Icheon-si (KR); An Bae Lee, Seoul (KR); Young Hwan Joo, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 43 days.

(21) Appl. No.: 12/489,019

(22) Filed: Jun. 22, 2009

(65) Prior Publication Data

US 2010/0190326 A1 Jul. 29, 2010

(30) Foreign Application Priority Data

Jan. 28, 2009 (KR) .................. 10-2009-0006580

(51) Int. Cl.
*H01L 21/8234* (2006.01)

(52) U.S. Cl. .................. 438/238; 438/398; 438/513; 257/E21.648

(58) Field of Classification Search .................. 438/238, 438/239, 253, 393, 396, 510, 513, 672, 675; 257/E27.048, E27.088, E29.345, E21.648
See application file for complete search history.

(56) References Cited

U.S. PATENT DOCUMENTS

| 6,617,631 B2 * | 9/2003 | Huang ...................... 257/296 |
| 6,642,097 B2 * | 11/2003 | Tu ............................. 438/241 |
| 2008/0233723 A1 | 9/2008 | Okumura et al. |
| 2009/0068823 A1 | 3/2009 | Hong et al. |

* cited by examiner

*Primary Examiner*—Brook Kebede
(74) *Attorney, Agent, or Firm*—Marshall, Gerstein & Borun LLP

(57) ABSTRACT

A method for fabricating a semiconductor memory device includes: forming a lower conductive layer over a semiconductor substrate; forming an insulation layer over the lower conductive layer; etching the insulation layer to form a contact hole that exposes a portion of the lower conductive layer; forming a contact plug in the contact hole; doping the contact plug by performing a plasma doping process while varying a temperature of regions the semiconductor substrate; and forming an upper conductive layer connected with the lower conductive layer through the contact plug.

10 Claims, 3 Drawing Sheets

METHOD FOR FABRICATING SEMICONDUCTOR MEMORY DEVICE

CROSS-REFERENCE TO RELATED APPLICATION

Priority to Korean patent application number 10-2009-0006580 filed Jan. 28, 2009, the entire disclosure of which is incorporated by reference, is claimed.

BACKGROUND OF THE INVENTION

The invention relates generally to a method for fabricating a semiconductor memory device and, more particularly, to a method for fabricating a semiconductor memory device capable of reducing contact resistance.

The sizes of contact holes of semiconductor memory devices have decreased with the increase in degree of integration of semiconductor memory devices. A dynamic random access memory (DRAM) device employs a landing plug contact to electrically connect an impurity region of a semiconductor substrate and a conductive layer thereabove, e.g. a bit line or a storage node. Thus, the landing plug contact is formed by filling a landing plug contact hole between word lines formed with gate stack with a conductive material wherein the bit line contact and the storage node contact are connected to the landing plug contact. In general, the landing plug contact comprises a polysilicon layer.

However, due to the decrease in the design rule according to the increase in the degree of integration, an area of an active region in which active devices such as transistors are arranged is reduced in size and, as the result, an area of the landing plug contact hole in which the landing plug contact is formed tends to be more and more reduced in size. As the area of the landing plug contact hole is reduced in size, the resistance of the landing plug contact is increased, while an operation current is reduced. Particularly, in a case of a bit line contact in which contact resistance is an important factor, the increase in the contact resistance obstructs generation of an efficient amount of operation current and this causes a deterioration of properties of a memory device requiring high speed operation.

As a method to overcome the problem resulting from the increase in the contact resistance, impurity ions may be implanted after forming the landing plug contact. In order to dope impurities to the landing plug contact, P-type impurities are doped by ion implantation or plasma doping after a conductive layer is deposited. However, the method of doping the conductive layer by ion implantation is inefficient since there is no mass-productivity, as 30 minutes or more are required per wafer to implant a large amount of P-type dopants to the conductive layer. The plasma doping can ensure the mass-productivity, but has a problem in that distribution of the contact resistance (Rc) in a semiconductor wafer deteriorates due to irregularity of plasma itself.

FIG. 1 is a graph showing distribution of contact resistance across the diameter of a wafer when doping a bit line contact using plasma doping and ion implantation, respectively. The X-axis represents the diameter of a semiconductor substrate and the Y-axis represents a magnitude of resistance per unit area.

Referring to FIG. 1, near the periphery of the semiconductor substrate, the distribution of the contact resistance is up to 200% is shown in Case 120 (doping the bit line contact by the plasma doping) as compared to Case 110 (doping the bit line contact by the ion implantation).

Therefore, it is necessary to provide a method capable of improving the distribution of the contact resistance (Rc) in the semiconductor substrate while effectively reducing the contact resistance using the plasma doping.

SUMMARY OF THE INVENTION

Embodiments of the invention are directed to a method for fabricating a semiconductor memory device capable of improving distribution of contact resistance (Rc) in a semiconductor substrate while reducing the contact resistance.

In one embodiment, a method for fabricating a semiconductor memory device includes: forming a lower conductive layer over a semiconductor substrate; forming an insulation layer over the lower conductive layer; forming a contact hole that exposes a portion of the lower conductive layer by etching the insulation layer; forming a contact plug in the contact hole; doping the contact plug by performing a plasma doping process with varying a temperature of the semiconductor substrate by regions of the semiconductor substrate; and forming an upper conductive layer connected with the lower conductive layer through the contact plug.

In another embodiment, a method for fabricating a semiconductor memory device includes: forming gate stacks having side walls over a semiconductor substrate having an active region which is delimited by an isolation region; forming insulation spacers on the side walls of the gate stacks; filling spaces between the spacers with a first insulation layer; exposing the active region by removing the first insulation layer on the active region; forming a contact plug that fills the spaces between the spacers over the exposed portion of the active region; doping the contact plug by performing a plasma doping process while varying temperatures of regions of the semiconductor substrate; forming a second insulation layer over an entire face of the resulting product in which the contact plug is doped; exposing the contact plug to be formed with the bit line contact by removing a portion of the second insulation layer; and forming a bit line conductive layer so that the bit line conductive layer is in contact with the contact plug.

DESCRIPTION OF SPECIFIC EMBODIMENTS

The invention provides a method capable of reducing contact resistance while improving distribution of contact resistance in a semiconductor substrate to improve operation current and enable high speed operation by doping a surface of a contact at a high concentration using plasma doping equipment, which is able to control temperature by regions, without using conventional ion implantation equipment, in a process of doping a contact plug for improving the contact resistance.

FIGS. 2 to 6 are cross-sectional views illustrating a method for fabricating a semiconductor memory device in accordance with an embodiment of the invention.

Figure 1:
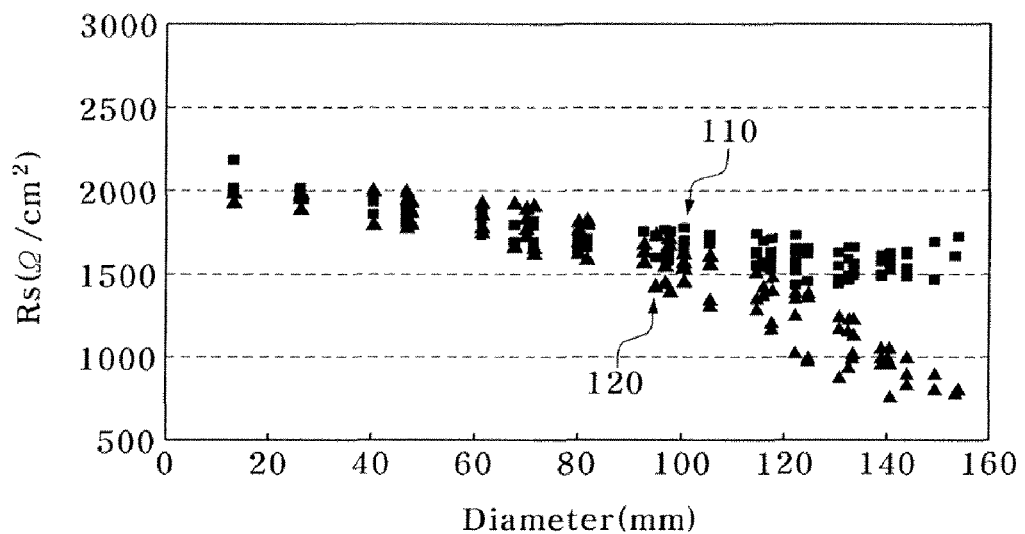
FIG. 1 is a graph showing dispersion of a contact resistance when doping a bit line contact using a plasma doping and ion implantation, respectively.
Figure 2:
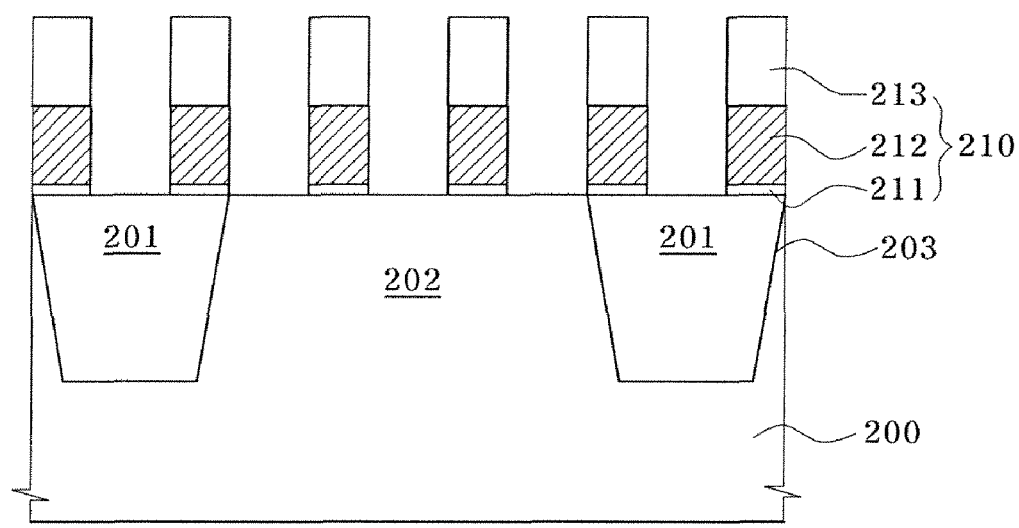
FIGS. 2 to 6 are cross-sectional views illustrating a method for fabricating a semiconductor memory device in accordance with an embodiment of the invention.

Referring to FIG. 2, a plurality of gate stacks 210 are formed over a semiconductor substrate 200, preferably a silicon (Si) substrate. The semiconductor substrate 200 has an active region 202 that is defined by an isolation region 201, and an isolation layer 203 is disposed in the isolation region 201. The plurality of gate stacks 210 are formed in such a structure that a gate insulation layer 211, a gate conductive layer 212, and a hard mask 213 are sequentially stacked. In one example, the gate insulation layer 211 comprises an oxide layer, the gate conductive layer 212 comprises a doped polysilicon layer, and the hard mask 213 comprises a nitride layer.

Figure 3:
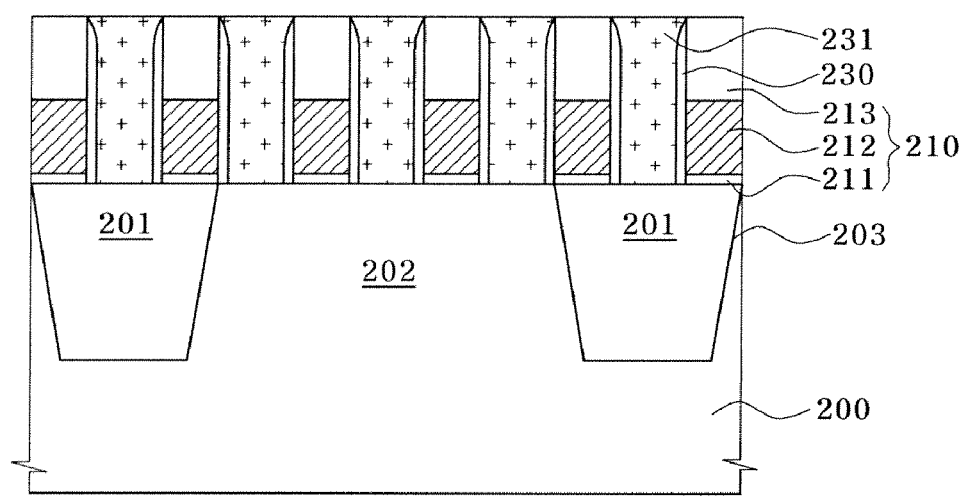

Referring to FIG. 3, a spacer 230 is formed on a side wall of the gate stack 210. To this end, an insulation layer for the spacer is formed first over entire surface of the semiconductor substrate, which is formed with the gate stack 210. In one example, an oxide layer, a nitride layer, or a silicon oxynitride layer ($Si_xO_yN_z$) is used as the insulation layer for the spacer. Next, an anisotropic etching, e.g. an etch back, on the insulation layer for the spacer is performed until an upper surface of the gate stack 210 and a surface of the semiconductor substrate 200 are exposed. Then, the insulation layer spacer 220 alone is left on the side wall of the gate stack 210. After the spacer 220 is formed, though not shown, an ion implantation process for forming an impurity region such as source/drain is performed on the active region 202 of the semiconductor substrate 200, as by performing a conventional ion implantation process.

Next, an insulation layer is deposited over the entire surface of the semiconductor substrate so that a space between the gate stack 210 having spacers 220 is filled, and a planarization process is performed on the insulation layer to form a planarized first insulation layer 231. This planarization process preferably is performed using chemical mechanical polishing (CMP) and preferably until a surface of the gate stack 210 is exposed.

Figure 4:
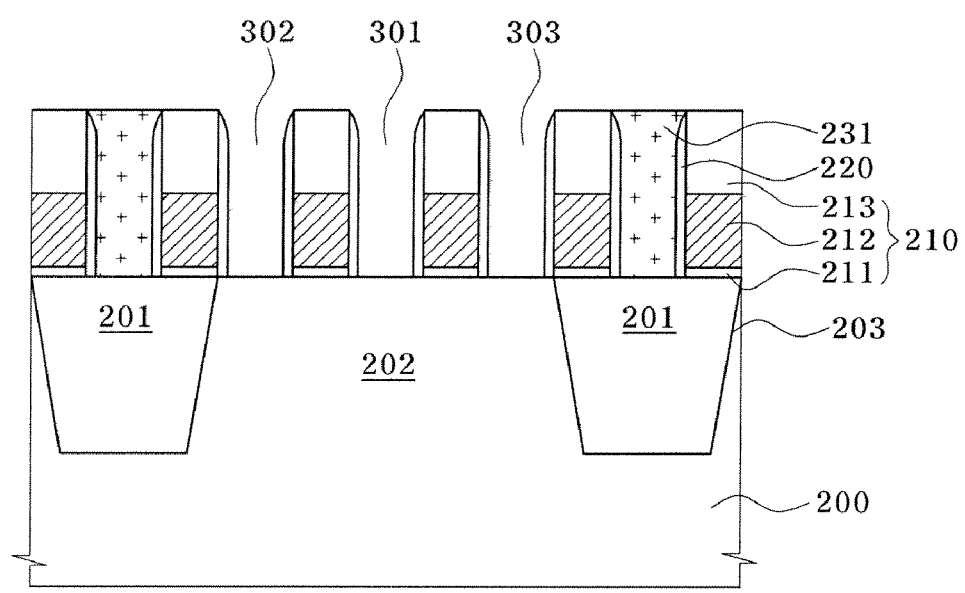

Referring to FIG. 4, the first insulation layer 231 filled between the gate stacks 210 is selectively removed to form landing plug contact holes 301, 302, 303 that expose a portion of the active region 202 of the semiconductor substrate 200. To selectively remove the first insulation layer 231, a photoresist pattern (not shown) that exposes the portion of first insulation layer 231 to be removed is formed first over the first insulation layer 231. Using the photoresist pattern as an etch mask, the exposed portion of the first insulation layer 231 is etched so that a surface of the active region 202 of the semiconductor substrate 200 is exposed. After the landing plug contact holes 301, 302, 303 are formed, the photoresist pattern is removed. The landing plug contact hole 301 is for electrical connection of the active region 202 and the bit line, and the landing plug contact holes 302, 303 are for electrical connection of the active region 202 and the storage node.

Figure 5:
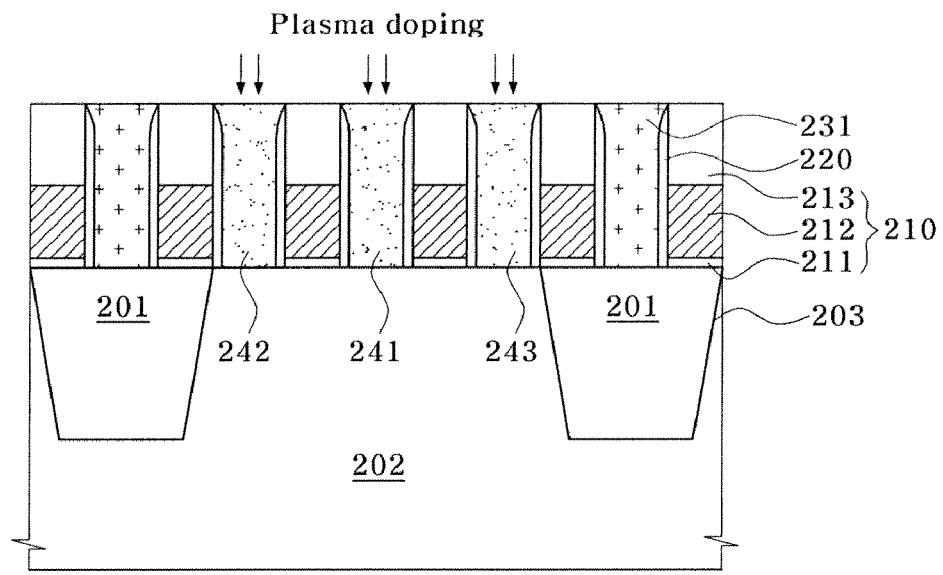

Referring to FIG. 5, over the resulting product formed with the landing plug contact hole, a conductive layer, e.g. a polysilicon layer is deposited so that the landing plug contact hole is filled. The polysilicon layer preferably is deposited by chemical vapor deposition (CVD). An etch back process is performed on the deposited polysilicon layer to form landing plug contacts 241, 242, 243. Next, the landing plug contacts 241, 242, 243 are doped at a high concentration to additionally reduce the contact resistance. At this time, P ions (atomic mass 31) or As ions (atomic mass 75) preferably are used as impurity ions. Also, the process of doping the landing plug contacts preferably is performed using a plasma doping, in which a plasma doping equipment capable of controlling, by regions, a temperature of a platen for mounting the semiconductor substrate thereon. The temperature of the platen preferably is controlled by regions in the range of 20° C. to 100° C., and a pressure of plasma gas, e.g. helium (He), xenon (Xe) or argon (Ar), preferably is controlled by regions in a range of 1 Torr to 20 Torr to control the temperature of the platen.

When performing a conventional plasma doping process, a temperature of a center of the semiconductor substrate preferably is about 10° C. lower than that of the periphery of the semiconductor substrate. Therefore, when performing the plasma doping to reduce the contact resistance, a difference in doping profile is generated between the center and the periphery of the semiconductor substrate and dispersion in the contact resistance is thus generated. However, when setting the temperature of the center of the semiconductor substrate to be higher than the temperature of the periphery of the semiconductor substrate using the platen capable of partially controlling the temperature as described above, the doping profile in the center and periphery of the semiconductor substrate become uniform in the plasma doping process and, consequently, the contact resistance of the landing plug contact becomes uniform over the entire region of the semiconductor substrate.

Figure 6:
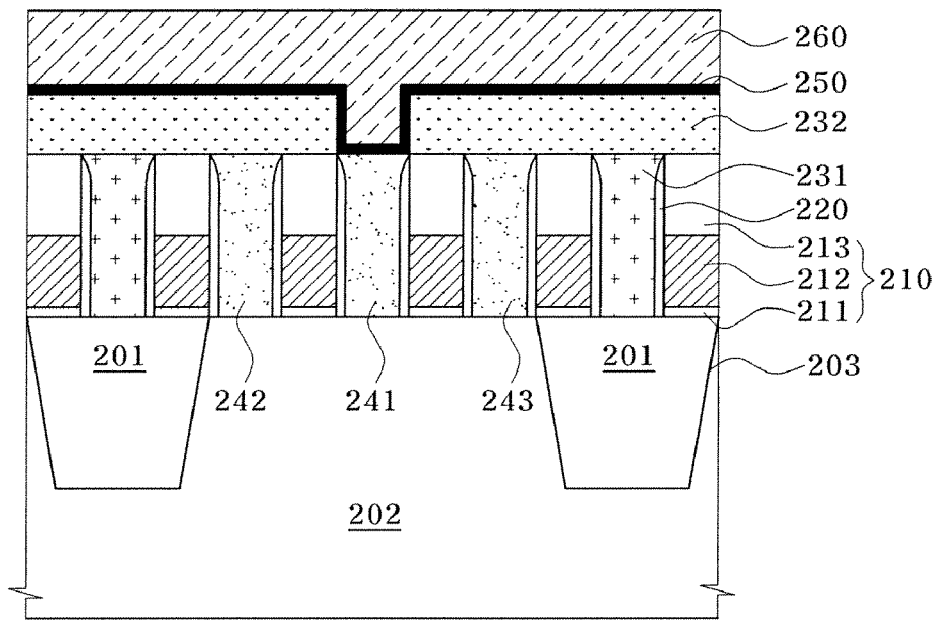

Referring to FIG. 6, over the resulting product where the doping on the landing plug contacts has been performed, a second insulation layer 232 is formed. The second insulation layer 232 preferably is formed of a material having enough etch selectivity to the spacer 220 to minimize an influence of the spacer 220 on the second insulation layer 232 in the subsequent process. Next, a photoresist pattern that exposes a portion to be formed with a bit line contact hole is formed over the second insulation layer 232. An etch using the photoresist pattern as a mask is performed to remove the exposed portion of the second insulation layer 232 and form the bit line contact hole. After removing the photoresist pattern, a barrier metal layer 250 is formed over the exposed surfaces of the second insulation layer 232, the spacer 220, and the landing plug 241. Next, a conductive layer is deposited over the barrier metal layer 250 to form a bit line conductive layer 260. The bit line conductive layer 260 preferably is formed of titanium (Ti), titanium nitride (TiN), cobalt (Co), nickel (Ni), or tungsten (W). Although the bit line contact is exemplified in the present embodiment, connection of the landing plug contact 242, 243 and the storage node of the capacitor can be performed similar thereto.

According to the invention, as compared to a case of using the conventional method in which the distribution of the contact resistance was about ~525Ω, the distribution of the contact resistance was improved to about ~394Ω or about −22% in a case of varying the temperature of the platen by regions. It could also be appreciated that the contact resistance was improved by about 10%.

As is apparent from the above description, in accordance with a method for fabricating a semiconductor memory device of the invention, it is possible to improve the distribution of the contact resistance in the semiconductor substrate while reducing the contact resistance by doping the surface of the contact at a high concentration using the plasma equipment capable of controlling a temperature by regions in the process of doping the contact plug for improve the contact resistance, thereby improving operation current and enabling high speed operation.

While the invention has been described with respect to the specific embodiments, various changes and modifications may be made without departing from the spirit and scope of the invention as defined in the following claims.

What is claimed is:

1. A method for fabricating a semiconductor memory device, comprising:
    forming a lower conductive layer over a semiconductor substrate;
    forming an insulation layer over the lower conductive layer;
    etching the insulation layer to form a contact hole that exposes a portion of the lower conductive layer;
    forming a contact plug in the contact hole;

doping the contact plug by performing a plasma doping process while varying a temperature of regions of the semiconductor substrate; and forming an upper conductive layer connected with the lower conductive layer through the contact plug.

2. The method of claim 1, comprising, in doping the contact plug, varying the temperature of the semiconductor substrate using a platen capable of partially controlling the temperature.

3. The method of claim 1, comprising, in doping the contact plug, controlling the temperature of the semiconductor substrate in a range of 20° C. to 100° C.

4. The method of claim 1, comprising, in doping the contact plug, controlling a pressure of a plasma gas over regions of the semiconductor substrate in a range of 1 Torr to 20 Torr.

5. The method of claim 1, comprising, in doping the contact plug, controlling a temperature in a center of the semiconductor substrate to be higher than a temperature in a periphery of the semiconductor substrate.

6. A method for fabricating a semiconductor memory device, comprising:

forming gate stack each having a side wall over a semiconductor substrate having an active region that is delimited by an isolation region;

forming insulation spacers on side walls of the gate stacks;

filling a space between the gate stacks with a first insulation layer;

removing the first insulation layer on the active region to expose the active region;

forming a contact plug that fills the space between the insulation spacers over the exposed portion of the active region;

doping the contact plug by performing a plasma doping process while varying a temperature of regions of the semiconductor substrate;

forming a second insulation layer over an entire face of the resulting product in which the contact plug is doped;

removing a portion of the second insulation layer to expose the contact plug to be formed with a bit line contact; and forming a bit line conductive layer that is in contact with the contact plug.

7. The method of claim 6, comprising, in doping the contact plug, controlling the temperature of the semiconductor substrate using a platen capable of partially controlling the temperature, and controlling the temperature of the platen in a range of 20° C. to 100° C.

8. The method of claim 6, comprising, in doping the contact plug, controlling a pressure of a plasma gas over regions of the semiconductor substrate in a range of 1 Torr to 20 Torr.

9. The method of claim 6, comprising, in doping the contact plug, controlling a temperature in a center of the semiconductor substrate to be higher than a temperature in a periphery of the semiconductor substrate.

10. The method of claim 6, comprising, in doping the contact plug, using P ions or As ions as the impurity ion.

* * * * *